(12) United States Patent
Zhu et al.

(10) Patent No.: US 8,729,611 B2
(45) Date of Patent: May 20, 2014

(54) SEMICONDUCTOR DEVICE HAVING A PLURALITY OF FINS WITH DIFFERENT HEIGHTS AND METHOD FOR MANUFACTURING THE SAME

(75) Inventors: Huilong Zhu, Poughkeepsie, NY (US);
Haizhou Yin, Poughkeepsie, NY (US);
Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/503,693

(22) PCT Filed: Nov. 18, 2011

(86) PCT No.: PCT/CN2011/082399
§ 371 (c)(1),
(2), (4) Date: Apr. 24, 2012

(87) PCT Pub. No.: WO2013/033952
PCT Pub. Date: Mar. 14, 2013

(65) Prior Publication Data
US 2013/0062672 A1    Mar. 14, 2013

(30) Foreign Application Priority Data
Sep. 8, 2011  (CN) .......................... 2011 1 0265073

(51) Int. Cl.
*H01L 27/088*  (2006.01)
(52) U.S. Cl.
USPC ........................................ 257/289; 257/401
(58) Field of Classification Search
USPC ................................................ 257/289, 401
See application file for complete search history.

(56) References Cited

U.S. PATENT DOCUMENTS

| | | | | |
|---|---|---|---|---|
| 7,544,994 | B2 * | 6/2009 | Schepis et al. | 257/327 |
| 7,612,405 | B2 * | 11/2009 | Yu et al. | 257/328 |
| 7,902,035 | B2 * | 3/2011 | Yu et al. | 438/424 |
| 8,460,984 | B2 * | 6/2013 | Wahl et al. | 438/164 |
| 2005/0239242 | A1 * | 10/2005 | Zhu et al. | 438/199 |
| 2008/0122013 | A1 * | 5/2008 | Schepis et al. | 257/401 |
| 2008/0224258 | A1 * | 9/2008 | Schepis et al. | 257/522 |
| 2009/0253266 | A1 * | 10/2009 | Yu et al. | 438/700 |
| 2011/0037129 | A1 * | 2/2011 | Yu et al. | 257/401 |
| 2011/0042748 | A1 * | 2/2011 | Anderson et al. | 257/365 |
| 2013/0049136 | A1 * | 2/2013 | Wahl et al. | 257/401 |
| 2013/0115777 | A1 * | 5/2013 | Tung et al. | 438/703 |

FOREIGN PATENT DOCUMENTS

| | | |
|---|---|---|
| CN | 101221928 A | 7/2008 |
| CN | 101261991 A | 9/2008 |

OTHER PUBLICATIONS

International Search Report and Written Opinion issued Jun. 14, 2012, by the China Patent Office in related Chinese Patent Application No. PCT/CN2011/082399 (9 pages).
Espacenet English Abstract for CN101221928 (1 page).
Espacenet English Abstract for CN101261991 (2 pages).

* cited by examiner

*Primary Examiner* — Ngan Ngo
(74) *Attorney, Agent, or Firm* — Osha Liang LLP

(57) ABSTRACT

The present disclosure provides a semiconductor device and a method for manufacturing the same. The semiconductor device comprises: a semiconductor layer comprising a plurality of semiconductor sub-layers; and a plurality of fins formed in the semiconductor layer and adjoining the semiconductor layer, wherein at least two of the plurality of fins comprise different numbers of the semiconductor sub-layers and have different heights. According to the present disclosure, a plurality of semiconductor devices with different dimensions and different driving abilities can be integrated on a single wafer.

6 Claims, 5 Drawing Sheets

SEMICONDUCTOR DEVICE HAVING A PLURALITY OF FINS WITH DIFFERENT HEIGHTS AND METHOD FOR MANUFACTURING THE SAME

This application is a National Phase application of, and claims priority to, PCT Application No. PCT/CN2011/082399, filed on Nov. 18, 2011, entitled "SEMICONDUCTOR DEVICE AND METHOD FOR MANUFACTURING THE SAME", which claimed priority to Chinese Application No. 201110265073.X, filed on Sep. 8, 2011. Both the PCT Application and Chinese Application are incorporated herein by reference in their entireties.

TECHNICAL FIELD

The present disclosure relates to the field of semiconductor, and in particular, to semiconductor devices with different device dimensions and a method for manufacturing the same.

BACKGROUND

Fin Field Effect Transistors (FinFETs) have attracted much attention due to their excellent performance in suppressing the short channel effects. FIG. 1 shows a perspective view of an existing FinFET device. As shown in FIG. 1, the FinFET comprises: a bulk-Si semiconductor substrate 100; a fin 101 formed on the bulk-Si semiconductor substrate 100; and a gate stack 102 astride the fin 101. The gate stack 102 comprises a gate dielectric layer, a gate electrode layer (not shown), and an isolation layer (e.g. $SiO_2$) 103, for example. In the FinFET, under the control of the gate electrode, conductive channels are created in the fin, specifically, in three surfaces (a left side surface, a right side surface, and a top surface in the figure) of the fin 101. In other words, the portions of the fin 101 under the gate electrode serve as a channel region. A source region and a drain region are located at opposing sides of the channel region.

In the example shown in FIG. 1, the FinFET is formed on the bulk-Si semiconductor substrate. However, the FinFET can also be formed on other types of substrate, such as a Silicon-on-Insulator (SOI) substrate. Furthermore, the FinFET shown in FIG. 1 is called a tri-gate FET, because the channel are formed in three surfaces of the fin 101. Alternatively, a double-gate FET may be formed by arranging an isolation layer (e.g. a nitride layer, etc.) between the top surface of the fin 101 and the gate stack 102. In such a case, the top surface of the fin 101 is not controlled by the gate electrode, and therefore no channel will be created therein.

Although the FinFET provides improved performances in comparison with conventional Metal Oxide Semiconductor Field Effect Transistors (MOSFETs), it also brings some design challenges. In particular, there are generally no limitations on the device widths for the conventional MOSFETs, but the fins of the FinFETs typically need to be of the same height. This is because the fins in different FinFETs need to have the same physical width in order to ease lithographic patterning of the fins.

In other words, the conventional MOSFET has two parameters, i.e. a channel width W and a channel length L, for controlling the on current and the cutoff current of the transistor. However, the FinFET only has one parameter, the length L of the Fin, for controlling the on current and the cutoff current of the transistor. This is because the fin has a fixed height and therefore the channel width is fixed. As a result, for a given length L of the transistor, which defines a ratio between the on current and the cutoff current, the on current amount from one fin is fixed.

However, high-performance integrated circuits usually need transistors with varied on currents. One way to vary the on currents is to change driving abilities of respective devices by varying their fin heights. Layout area will not increase because only vertical dimensions are changed.

However, there has not been any effective way to change the fin heights. Therefore, a new semiconductor manufacturing process is needed for integrating a plurality of semiconductor devices with different device dimensions or fin heights on a single wafer.

SUMMARY

The present disclosure provides, among other things, a new semiconductor device structure and a method for manufacturing the same. According to the present disclosure, different etching depths for fins can be obtained by means of etching-stop sub-layers, whereby devices with different device dimensions can be formed.

According to an aspect of the present disclosure, there is provided a semiconductor device, comprising: a semiconductor layer comprising a plurality of semiconductor sub-layers; and a plurality of fins formed in the semiconductor layer and adjoining the semiconductor layer, wherein at least two of the plurality of fins comprise different number of the semiconductor sub-layers and have different heights.

Optionally, adjacent semiconductor sub-layers of the plurality of semiconductor sub-layers may be made of different materials, such that the adjacent semiconductor sub-layers have etching selectivities with respect to each other.

Optionally, the semiconductor layer may comprise alternately stacked fin-body material sub-layers and etching-stop sub-layers, wherein thicknesses of the fin-body material sub-layers are larger than those of the etching-stop sub-layers.

For example, the fin-body material sub-layers may comprise Si, and the etching-stop sub-layers may comprise SiGe.

Optionally, the semiconductor device may also comprise gate stacks being formed astride respective ones of the plurality of fins. The gate stacks may be isolated from the semiconductor layer via an isolation layer.

According to another aspect of the present disclosure, there is provided a method for manufacturing a semiconductor device, comprising: providing a semiconductor layer comprising a plurality of semiconductor sub-layers; and patterning the semiconductor layer to form a plurality of fins in the semiconductor layer and adjoining the semiconductor layer, wherein at least two of the plurality of fins are formed by patterning different number of the semiconductor sub-layers and have different heights.

Optionally, adjacent semiconductor sub-layers of the plurality of semiconductor sub-layers may be made of different materials, such that the adjacent semiconductor sub-layers have etching selectivities with respect to each other.

Optionally, the semiconductor layer may comprise alternately stacked fin-body material sub-layers and etching-stop sub-layers, wherein thicknesses of the fin-body material sub-layers are larger than those of the etching-stop sub-layers. For example, the fin-body material sub-layers may comprise Si, and the etching-stop sub-layers may comprise SiGe.

Optionally, forming the plurality of fins may comprise: patterning a region of the semiconductor layer to form one of the plurality of fins from a first number of the semiconductor sub-layers; and patterning another region of the semiconductor layer to form another one of the plurality of fins from a second number of the semiconductor sub-layers, wherein the second number is different from the first number.

Optionally, the method may further comprise forming gate stacks astride respective ones of the plurality of fins. Optionally, the method may further comprise, before forming the gate stacks, forming an isolation layer on the semiconductor layer, wherein the gate stacks may be isolated from the semiconductor layer by the isolation layer.

As described above, the semiconductor device structure and the method for manufacturing the same according to the present disclosure can form the fins with different heights by etching the semiconductor layer, from which the fins are formed, to different depths. This provides channels with different widths and different device dimensions, whereby provides devices with different driving capabilities.

BRIEF DESCRIPTION OF THE DRAWINGS

The above and other objects, features, and advantages of the present disclosure will become more apparent from the following description of embodiments of the present disclosure with reference to the drawings, wherein.

DETAILED DESCRIPTION OF EMBODIMENTS

Figure 1:
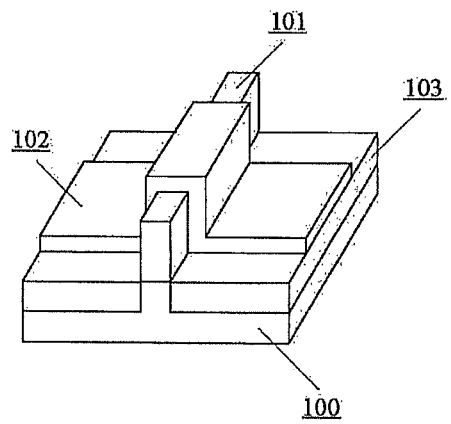
FIG. 1 shows a perspective view of an existing FinFET device.

Next, the present disclosure will be described by specific embodiments shown in the drawings. However, it should be understood that these descriptions are only exemplary rather than intending to limit the scope of the present disclosure. Further, in the following description, explanations on well-known structures and technologies are omitted, in order not to unnecessarily obscure the concept of the present disclosure.

Various structural view and cross-sectional views of a semiconductor device according to embodiments of the present disclosure are shown in the drawings. These drawings are not drawn to scale. Some details may be enlarged and some may be omitted for purpose of clarity. The shapes of respective regions and layers, as well as relative sizes and position relationships thereof are only exemplary, and may be varied due to manufacture tolerances or technique limitations in practice. One of ordinary skill in the art may otherwise design regions/layers having different shapes, sizes, or relative positions according to actual requirements.

The present disclosure provides a semiconductor device, comprising: a semiconductor layer comprising a plurality of semiconductor sub-layers; and a plurality of fins formed in the semiconductor layer and adjoining the semiconductor layer, wherein at least two of the plurality of fins comprise different number of the semiconductor sub-layers and have different heights.

Optionally, adjacent semiconductor sub-layers may be made of different materials, so that the two adjacent semiconductor sub-layers have different etching selectivities with respect to each other. According to such a structure, the etching of an upper semiconductor sub-layer can selectively stop at a lower semiconductor sub-layer. That is, the lower semiconductor sub-layer functions as an etching-stop layer of the upper semiconductor sub-layer. In this way, etching depths and therefore dimensions of the semiconductor device can be precisely controlled.

According to the present disclosure, a plurality of fins may be formed in the semiconductor layer. Each of the fins may comprise a certain number of semiconductor sub-layers. Therefore, the plurality of fins may have different heights depending on the number of semiconductor sub-layers they each have. Alternatively, two or more fins may have the same height if necessary.

According to the present disclosure, the fins of different heights can be formed, therefore channels of different widths and thus devices with different driving abilities can be provided.

Figure 2:
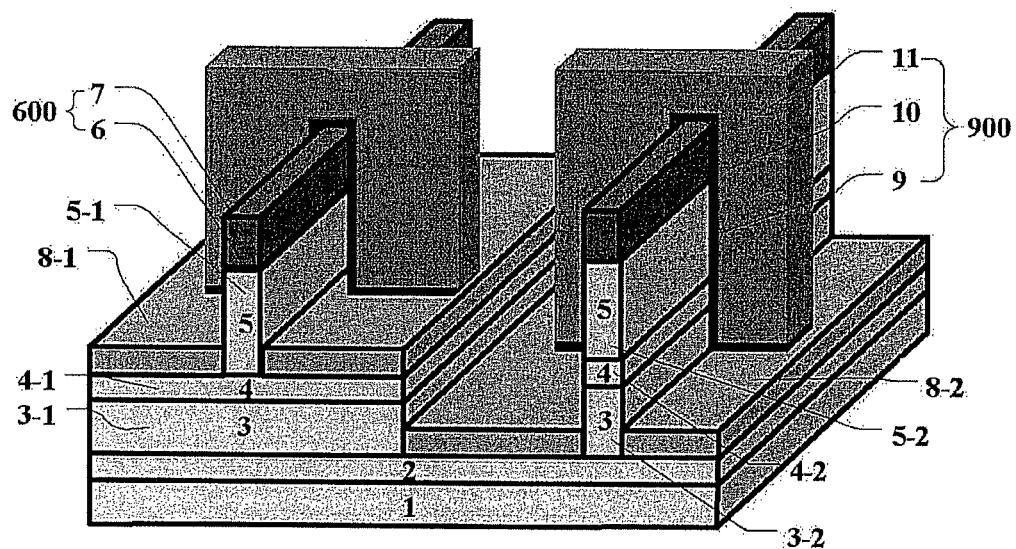
FIG. 2 shows a schematic perspective view of a semiconductor device according to an embodiment of the present disclosure.

FIG. 2 shows a schematic perspective view of an exemplary semiconductor device according to an embodiment of the present disclosure.

As shown in FIG. 2, a semiconductor layer is formed on Si substrate 1. The semiconductor layer comprises semiconductor sub-layers 2, 3-1/2, 4-1/2, and 5-1/2 being arranged in sequence. For example, the semiconductor sub-layer 2 may comprise SiGe with a thickness of about 2-15 nm, wherein Ge may have an atomic percentage of about 5-20%. The semiconductor sub-layer 3-1/2 may comprise Si with a thickness of about 20-150 nm. The semiconductor sub-layer 4-1/2 may comprise SiGe with a thickness of about 1-10 nm, wherein Ge may have an atomic percentage of about 5-20%. The semiconductor sub-layer 5-1/2 may comprise Si with a thickness of about 20-150 nm.

The fins may be formed by patterning the semiconductor sub-layers. In particular, the fin shown in the left portion of FIG. 2 is formed by the patterned semiconductor sub-layer 5-1. The fin shown in the right portion of FIG. 2 is formed by the patterned semiconductor sub-layers 3-2, 4-2, and 5-2.

Preferably, the semiconductor layer may comprise alternately stacked relatively thick fin-body material sub-layers and relatively thin etching-stop sub-layers. For example, in the foregoing embodiment, the relatively thick semiconductor sub-layers 3-1, 3-2, 5-1, and 5-2 function as the fin-body material sub-layers, which comprise, for example, Si in this embodiment. The relatively thin semiconductor sub-layers 2, 4-1, and 4-2 function as the etching-stop sub-layers for the fin-body material sub-layers. In this embodiment, the etching-stop sub-layers comprise SiGe, for example. By arranging the fin-body material sub-layers and the corresponding etching-stop sub-layers alternatively, etching of each fin-body material sub-layer can precisely stop at its corresponding etching-stop sub-layer. Therefore, the number of the fin-body material sub-layers, which is a main factor for determining the height of a fin, can be precisely controlled during the process of patterning the fin.

FIG. 2 further shows hard mask layer 600 on the top of the respective fins. Optionally, the hard mask layer 600 may comprise an oxide layer 6 and a nitride layer 7. The specific structure of the hard mask layer 600 is not shown. One of ordinary skill in the art will understand that the hard mask layer can be omitted.

The semiconductor device may further comprise gate stacks 900 astride the respective fins. Optionally, each gate stack 900 may comprise a gate dielectric layer 9, a work-function adjusting layer 10, and a gate electrode layer 11. The specific structure of the gate stacks 900 is not shown in the figure. The gate stacks is are isolated from the semiconductor layer by a respective isolation layer 8-1, 8-2. As shown in FIG. 2, for each device, at least the gate electrode layer and the work-function adjusting layer of the respective gate stack are isolated from each other, so as to enable electrical insulation therebetween. Furthermore, for each device, the isolation layer and the gate dielectric layer in the gate stack may be isolated from or adjoining each other, which will not affect the performance of the device.

According to the present disclosure, the fin in the left region (the first region) and the fin in the right region (the second region) have different heights. It should be noted that the "height" of a fin refers to the height from the top of the fin to the bottom of the fin, and the bottom of the fin refers to the top surface of the semiconductor layer which is adjoining the fin. For example, in the example shown in FIG. 2, the height of the fin in the first region is a height from the top of the semiconductor sub-layer 5-1 (i.e., the top of the fin in the first region) to the top of the semiconductor sub-layer 4-1 (i.e. the surface of the semiconductor layer outside the fin in the first region). The height of the fin in the second region is the height from the top of the semiconductor sub-layer 5-2 (i.e., the top of the fin in the second region) to the top of the semiconductor sub-layer 2 (i.e. the top surface of the semiconductor layer outside the fin in the second region).

Here, the term "adjoin" means that the fin is in direct contact with the semiconductor layer and there are no other material layers therebetween. In case that there are other layers, such as a substrate, under the semiconductor layer, the fin may penetrate the whole semiconductor layer (i.e. the fin is formed with the to entire thickness of the semiconductor layer). In such a case, the bottom of the fin coincides with the bottom of the semiconductor layer. In the present disclosure, such a case is also considered as the fin being "adjoining" the semiconductor layer, because there are no other material layers between the fin and the semiconductor layer.

According to the present disclosure, since the bottom of the fin adjoins the semiconductor layer, the finally obtained device can have a good performance of heat dissipation.

According to the present disclosure, the semiconductor layer comprises a plurality of semiconductor sub-layers, e.g., the above-described alternate stack of SiGe and Si. Adjacent semiconductor sub-layers are formed of different materials, such that the adjacent sub-layers have etching selectivities with respect to each other. As a result, the semiconductor sub-layers can be selectively etched on a layer-by-layer basis. Therefore, during the process of patterning the fins, the number of the semiconductor sub-layers from which a device is formed can be controlled precisely, and therefore the height of the fin (i.e., the channel width of the final device) can be controlled precisely.

FIGS. 3-10 show respective steps of a method for manufacturing a semiconductor device according to embodiments of the present disclosure.

Next, an exemplary method for manufacturing the semiconductor device shown in FIG. 2 will be described with reference to FIGS. 3-10. The following description will be based on Si-based materials as an example. However, it should be understood that the present disclosure is not limited to the Si-base materials, but can be applied to various other semiconductor materials.

Figure 3:
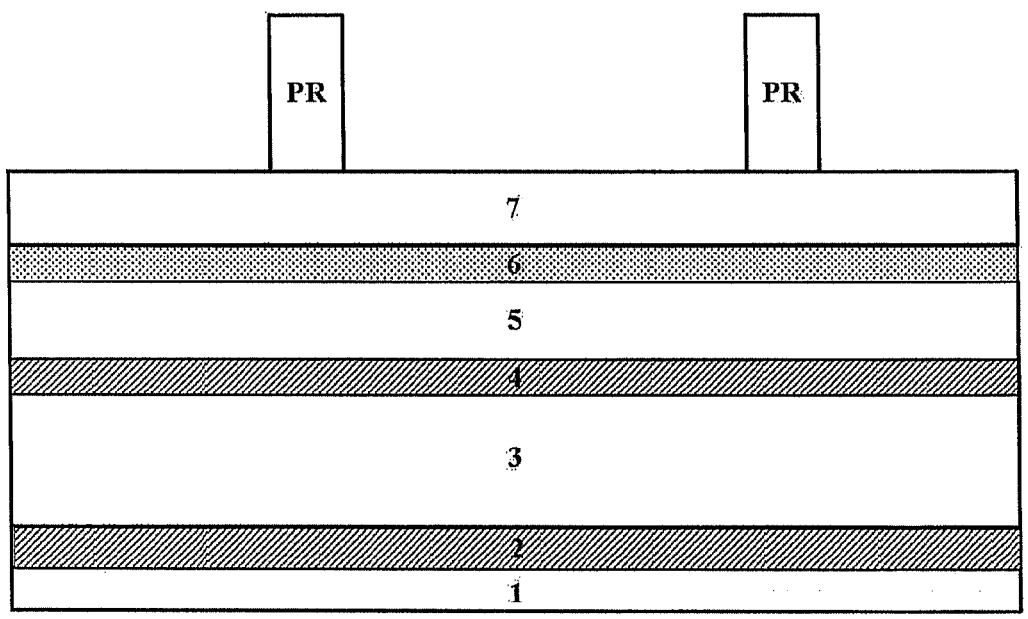
FIGS. 3-10 schematically show respective steps of a method for manufacturing a semiconductor device according to embodiments of the present disclosure.

As shown in FIG. 3, a semiconductor layer comprising a plurality of semiconductor sub-layers are epitaxially grown on a substrate 1. The semiconductor layer comprises semiconductor sub-layers 2, 3, 4, and 5 being stacked in sequence. For example, the substrate 1 may be a bulk-Si substrate. The semiconductor sub-layer 2 may be a SiGe layer with a thickness of about 2-15 nm, wherein Ge may have an atomic percentage of about 5-20%. The semiconductor sub-layer 3 may be a Si layer with a thickness of about 20-150 nm. The semiconductor sub-layer 4 may be a SiGe layer with a thickness of about 1-10 nm, wherein Ge may have an atomic percentage of about 5-20%. The semiconductor sub-layer 5 may be a Si layer with a thickness of about 20-150 nm.

Then, an oxide (e.g. silicon oxide) layer 6 and a nitride (e.g. silicon nitride) layer 7 are formed on the semiconductor layer in sequence. The oxide layer 6 and the nitride layer 7 as a whole are referred to as a layer 600 hereinafter. For example, the oxide layer has a thickness of about 2-5 nm, and the nitride layer has a thickness of about 10-50 nm. The oxide layer and the nitride layer are later used as a hard mask 600. Furthermore, a patterned photoresist PR is formed on the nitride layer. The patterned photoresist PR is located in regions where fins are to be formed.

Figure 4:
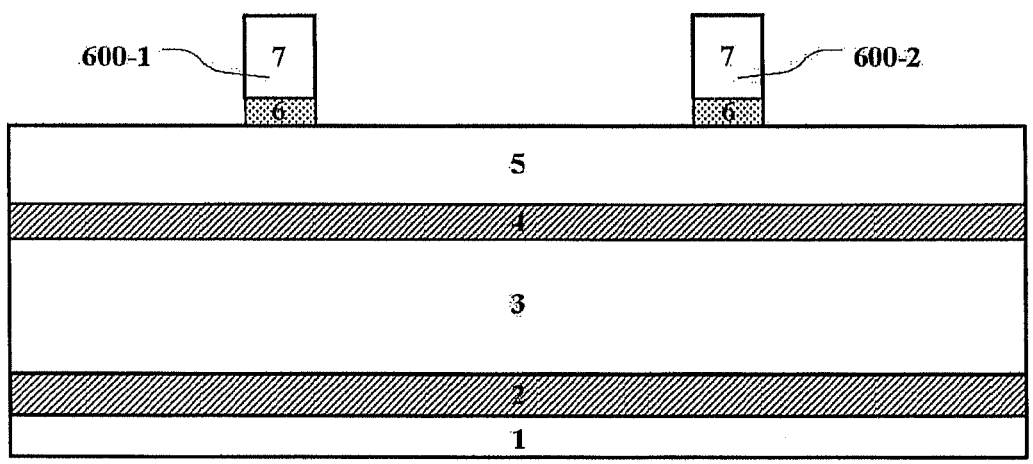

Next, as shown in FIG. 4, the hard mask layer 600 is patterned. In particular, the nitride layer is etched by, e.g., Reactive Ion Etching (RIE), using the patterned PR as a mask. The etching stops at the oxide layer. Then, the oxide layer is etched by, e.g. RIE, and the etching stops at the Si sub-layer 5. In this way, patterned hard mask layers 600-1 and 600-2 are formed. Then the photoresist PR is removed.

Figure 5:
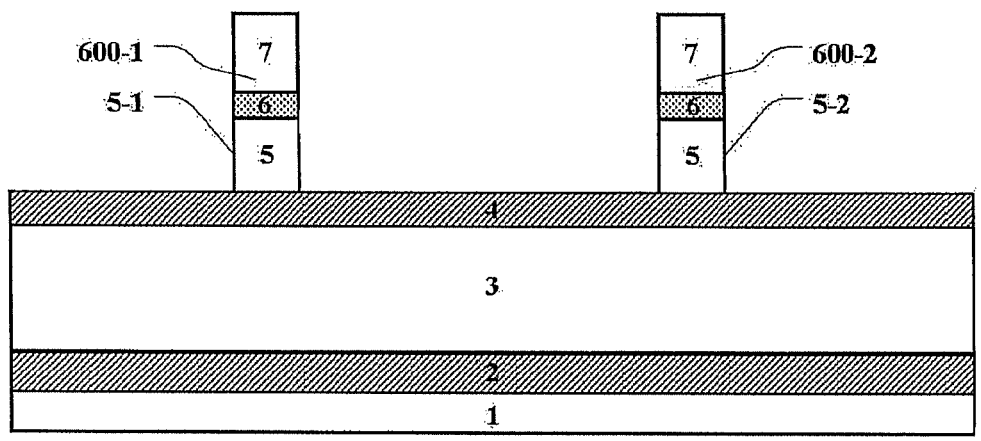
Figure 6:
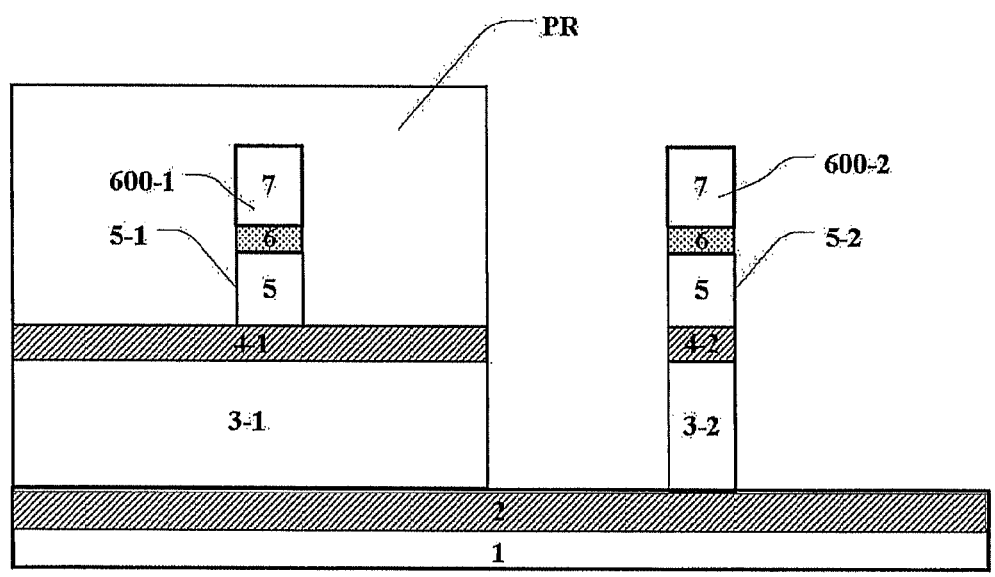

Next, as shown in FIGS. 5 and 6, the semiconductor layer is patterned by, e.g. RIE, using the patterned hard mask layers 600-1 and 600-2 as a mask, so as to form fins in the semiconductor layer. In particular, first, as shown in FIG. 5, the Si sub-layer 5 is selectively etched with respect to the SiGe sub-layer 4, so as to obtain patterned Si sub-layers 5-1 and 5-2. Then, as shown in FIG. 6, the left region ("the first region") is covered by a protection layer, e.g., photoresist PR, and the right region ("the second region") is patterned. In particular, in the second region, the SiGe sub-layer 4 is selectively etched with respect to the Si sub-layer 3, so as to obtain a patterned SiGe sub-layer 4-2. The portion of the SiGe sub-layer 4 remaining in the first region is shown as 4-1. The Si sub-layer 3 is selectively etched with respect to the SiGe sub-layer 2, so as to obtain a patterned Si sub-layer 3-2. The portion of the Si sub-layer 3 remaining in the first region is shown as 3-1. In the above steps, the SiGe sub-layers 2 and 4 serve as etching-stop layers, whereby the etching of the Si sub-layers 3 and 5 can selectively stop at the SiGe sub-layers, respectively. In this way, the etching depth can be precisely controlled, and therefore the height of the fin can be controlled.

Figure 7:
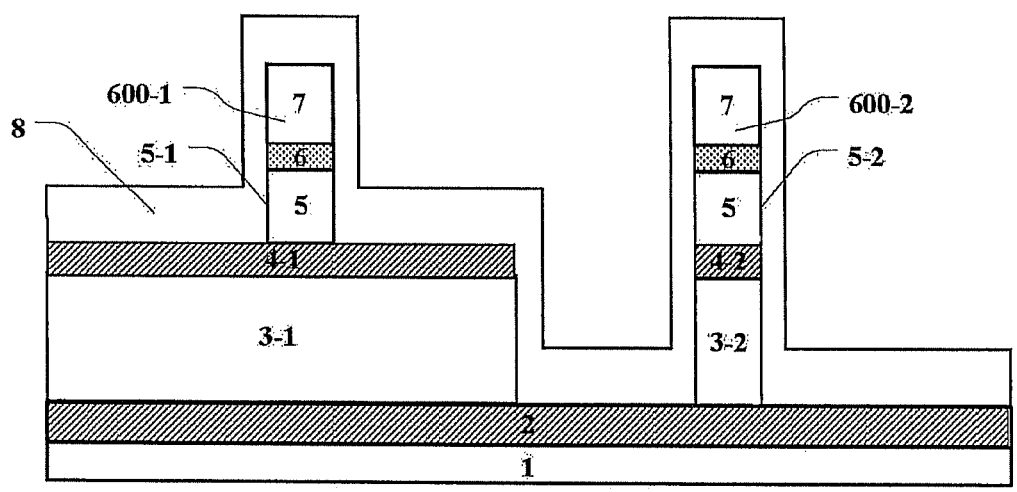

Finally, the protection layer PR is removed and a structure as shown in FIG. 7 is obtained. As shown in FIG. 7, the first region comprises a first fin, which comprises the patterned Si sub-layer 5-1 and has the hard mask layer 600-1 on its top. The second region comprises a second fin, which comprises the patterned Si sub-layer 5-2, the patterned SiGe sub-layer 4-2, and the patterned Si sub-layer 3-2, and has the hard mask layer 600-2 on its top. It should be noted that the hard mask layer 600-1/2 may be removed in subsequent processes.

According to the present disclosure, adjacent semiconductor sub-layers (i.e., a Si sub-layer and a SiGe sub-layer) comprise different materials and have etching selectivities with respect to each other. Therefore, when the fins are patterned, the semiconductor sub-layers can be etched layer-by-layer, whereby the heights of the fins finally being formed can be controlled precisely. According to the present disclosure, the first fin and the second fin are made of different number of patterned semiconductor sub-layers, and therefore have different heights.

Figure 8:
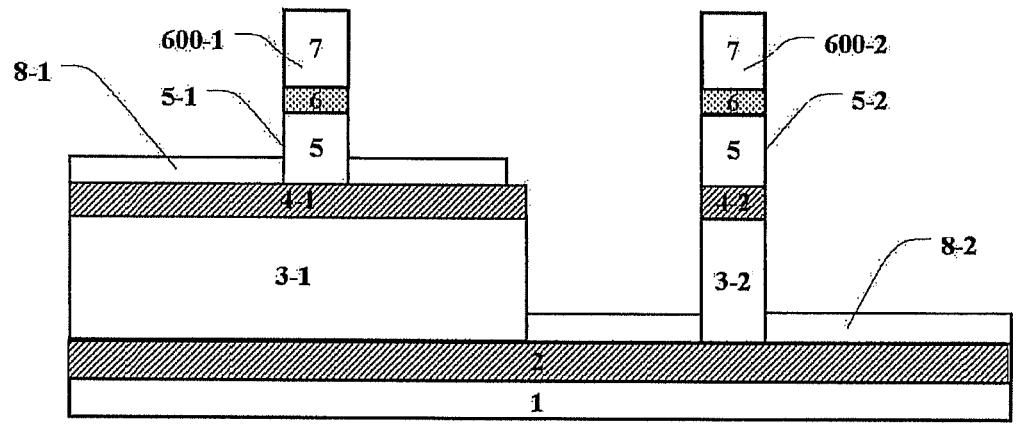

Next, as shown in FIG. 7, an isolation layer is formed at both sides of the respective fins and on the semiconductor layer. In particular, first, as shown in FIG. 7, an oxide to layer 8 is deposited on the whole structure. The oxide layer 8 may comprise, e.g., High-Density Plasma (HDP) oxide (e.g., $SiO_2$). The oxide layer 8 is relatively thicker at bottom, but is relative thinner on side faces of the fins. Then, as shown in FIG. 8, the oxide layer 8 is isotropically etched back to expose side faces of the fins. In this way, the isolation layer 8-1/2 is formed.

Figure 9:
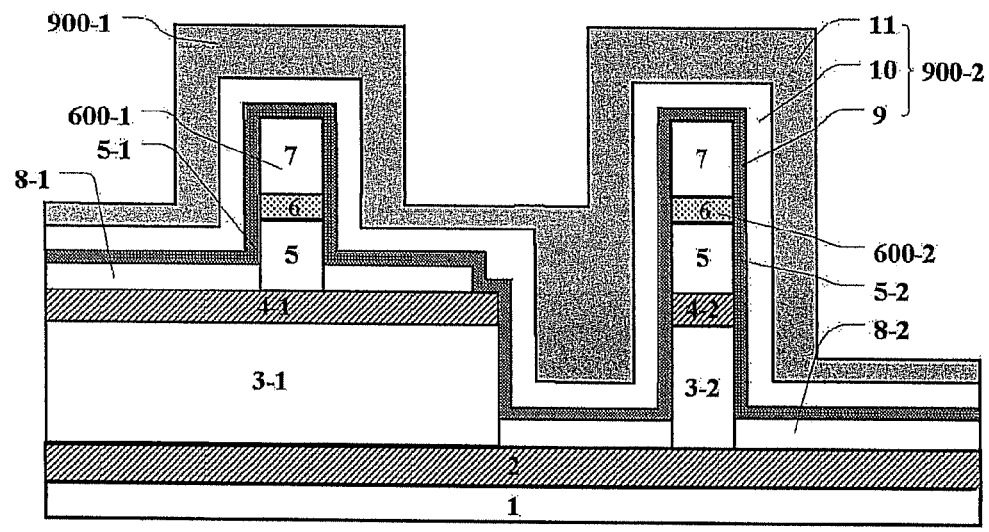

Then, as shown in FIG. 9, a gate dielectric layer 9, a work-function adjusting layer 10, and a gate electrode layer 11 are formed astride the fins. For example, the gate dielectric layer 9 comprises high-K gate dielectric with a thickness of about 2-4 nm. For example, the high-K gate dielectric may be selected from a group consisting of $HfO_2$, HfSiO, HfSiON, HfTaO, HfTiO, HfZrO, $Al_2O_3$, $La_2O_3$, $ZrO_2$, and LaAlO, etc. The gate electrode 11 may comprise polysilicon or metal. For example, the metal may be selected from a group consisting of Ti, Co, Ni, Al, and W, etc. More preferably, the work-function adjusting layer 10 may be sandwiched between the gate dielectric layer 9 and the gate electrode layer 11. For example, the work-function adjusting layer may comprise one material selected from a group consisting of TiN, TiAlN, TaN, TaAlN, and TaC, etc.

Figure 10:
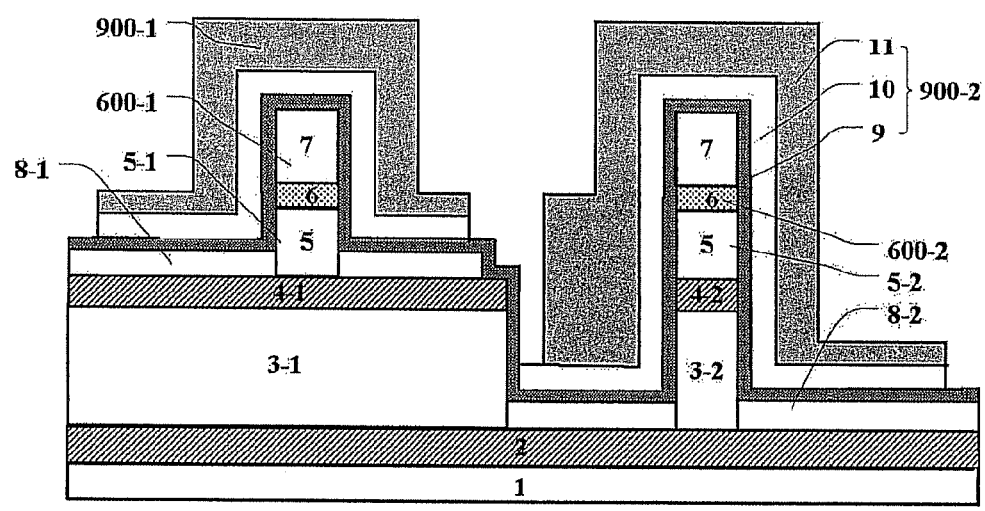

Next, as shown in FIG. 10, gate stacks are formed by patterning. In particular, the gate electrode 11, the work-function adjusting layer 10 (and optionally the gate dielectric layer 9) are etched by, e.g. RIE. In this way, the respective gate stacks are electrically isolated from each other and thus gate stacks 900-1/2 are obtained. Then, source/drain regions and metal interconnections may be manufactured as in conventional processes to obtain the final device.

To this end, the semiconductor device according to the present disclosure is obtained. A perspective view of the semiconductor device is similar to that shown in FIG. 2, except that FIG. 2 does not show the specific structure of the gate stacks.

According to embodiments of the present disclosure, the semiconductor layer is patterned in such a way that in the first region, the other portion of the semiconductor layer recess to a certain depth (herein referred to as "a first depth") with respect to the fin, and in the second region, the other portion of the semiconductor layer recess to another certain depth (herein referred to as "a second depth") with respect to the fin. By setting different recessed depths in the first and second regions (i.e., the first depth is different from the second depth), fins with different heights can be formed in the first region and the second region, wherein the heights of the fins correspond to the first depth and the second depth, respectively.

In the above embodiments of the present disclosure, the semiconductor layer comprises four semiconductor sub-layers for example. However, the present disclosure is not limited thereto. More semiconductor sub-layers can be used according to actual requirements (e.g., more fins of different heights need to be formed). Furthermore, although embodiments of two fins are shown for example, it is apparent that the present disclosure can be applied to cases of more fins. In such cases, the number of the semiconductor sub-layers and the etching processes may increase correspondingly according to the manufacturing method described in the present disclosure, and detailed description thereof will be omitted to avoid redundancy.

In the above description, technique details such as patterning and etching of respective layers are not specifically explained. However, one of ordinary skill in the art will understand that the layers and regions, etc. having desired shapes may be formed by various approaches in the prior art. Further, one of ordinary skill in the art may design a method not completely the same as above to form the same structure. Although various embodiments have been described, it does not mean that advantageous features in these embodiments cannot be combined.

It should be understood that the foregoing embodiments of the present disclosure are only used for illustrating or explaining the principle of the present disclosure rather than limiting the scope thereof. Any modifications, substitutions, and improvements without departing from the spirit and scope of the present disclosure will fall within the scope of the present disclosure. The claims of the present disclosure intend to cover all variations and modifications that fall within the scope and border of the present disclosure or equivalents thereof.

What is claimed is:

1. A semiconductor device, comprising:
a semiconductor layer comprising a plurality of semiconductor sub-layers; and
a plurality of fins formed in the semiconductor layer and adjoining the semiconductor layer,
wherein at least two of the plurality of fins comprise different number of the semiconductor sub-layers and have different heights.

2. The semiconductor device according to claim 1, wherein adjacent semiconductor sub-layers of the plurality of semiconductor sub-layers are made of different materials, such that the adjacent semiconductor sub-layers have etching selectivities with respect to each other.

3. The semiconductor device according to claim 1, further comprising gate stacks being formed astride respective ones of the plurality of fins.

4. The semiconductor device according to claim 2, wherein the semiconductor layer comprises alternately stacked fin-body material sub-layers and etching-stop sub-layers, wherein thicknesses of the fin-body material sub-layers are larger than those of the etching-stop sub-layers.

5. The semiconductor device according to claim 4, wherein the fin-body material sub-layers comprise Si, and the etching-stop sub-layers comprise SiGe.

6. The semiconductor device according to claim 3, wherein the gate stacks are isolated from the semiconductor layer by an isolation layer.

* * * * *